United States Patent
Zhang et al.

(10) Patent No.: US 10,643,511 B2
(45) Date of Patent: May 5, 2020

(54) ELECTRONIC DEVICE DISPLAY WITH MONITORING CIRCUITRY

(71) Applicant: Apple Inc., Cupertino, CA (US)

(72) Inventors: Rui Zhang, Santa Clara, CA (US); Mohammad Hajirostam, Cupertino, CA (US); Hung Sheng Lin, San Jose, CA (US); Mohammad B. Vahid Far, San Jose, CA (US); Sang Y. Youn, Cupertino, CA (US); Zhen Zhang, San Jose, CA (US); Prashant Mandlik, Sunnyvale, CA (US); Sun-Il Chang, San Jose, CA (US); Jie Won Ryu, Sunnyvale, CA (US); Shengkui Gao, San Jose, CA (US); Hyunwoo Nho, Palo Alto, CA (US); Wei H. Yao, Palo Alto, CA (US); Yafei Bi, Palo Alto, CA (US); Yun Wang, San Jose, CA (US)

(73) Assignee: Apple Inc., Cupertino, CA (US)

(*) Notice: Subject to any disclaimer, the term of this patent is extended or adjusted under 35 U.S.C. 154(b) by 204 days.

(21) Appl. No.: 15/275,109

(22) Filed: Sep. 23, 2016

(65) Prior Publication Data
US 2018/0053466 A1  Feb. 22, 2018

Related U.S. Application Data

(60) Provisional application No. 62/377,483, filed on Aug. 19, 2016.

(51) Int. Cl.
*G09G 3/00* (2006.01)
*G09G 3/20* (2006.01)
(Continued)

(52) U.S. Cl.
CPC ............ *G09G 3/006* (2013.01); *G01L 1/2281* (2013.01); *G01M 5/0033* (2013.01);
(Continued)

(58) Field of Classification Search
CPC .............. G01L 1/2281; G09G 2330/12; G09G 2380/02; G09G 3/32; G09G 2300/0426;
(Continued)

(56) References Cited

U.S. PATENT DOCUMENTS 5,073,754 A * 12/1991 Henley ................. G09G 3/006
324/529
5,285,150 A * 2/1994 Henley ................ G01R 31/308
324/760.02
(Continued)

FOREIGN PATENT DOCUMENTS

JP 2014032057 2/2014
JP 2014139829 7/2014

*Primary Examiner* — Michael J Jansen, II
(74) *Attorney, Agent, or Firm* — Treyz Law Group, P.C.; G. Victor Treyz; Matthew R. Williams

(57) ABSTRACT

An electronic device may have a flexible display such as an organic light-emitting diode display. A strain sensing resistor may be formed on a bent tail portion of the flexible display to gather strain measurements. Resistance measurement circuitry in a display driver integrated circuit may make resistance measurements on the strain sensing resistor and a temperature compensation resistor to measure strain. A crack detection line may be formed from an elongated pair of traces that are coupled at their ends to form a loop. The crack detection line may run along a peripheral edge of the flexible display. Crack detection circuitry may monitor the resistance of the crack detection line to detect cracks. The crack detection circuitry may include switches that adjust the length of the crack detection line and thereby allow resistances to be measured for different segments of the line.

11 Claims, 9 Drawing Sheets

(51) Int. Cl.
| | |
|---|---|
| *G01M 5/00* | (2006.01) |
| *G01L 1/22* | (2006.01) |
| *H01L 27/32* | (2006.01) |
| *H01L 51/00* | (2006.01) |
| *G11C 7/04* | (2006.01) |
| *G11C 19/28* | (2006.01) |

(52) U.S. Cl.
CPC ............ *G01M 5/0083* (2013.01); *G09G 3/20* (2013.01); *H01L 27/3276* (2013.01); *H01L 51/0097* (2013.01); *G09G 2300/0426* (2013.01); *G09G 2330/12* (2013.01); *G09G 2380/02* (2013.01); *G11C 7/04* (2013.01); *G11C 19/28* (2013.01)

(58) Field of Classification Search
CPC .... G09G 3/006; G09G 3/20; G09G 2300/043; G09G 2310/0286; G09G 3/3266; G09G 3/3677; G11C 19/28; G11C 7/04; H01L 27/3276; H01L 51/0031; H01L 51/0097; H01L 2251/5338; H01L 27/3225; H05K 999/99; G01M 5/0033; G01M 5/0083
See application file for complete search history.

(56) References Cited

U.S. PATENT DOCUMENTS

| | | | | |
|---|---|---|---|---|
| 5,473,261 | A * | 12/1995 | Marumoto | G09G 3/006 324/760.02 |
| 6,100,865 | A * | 8/2000 | Sasaki | G09G 3/3648 345/92 |
| 6,670,953 | B1 * | 12/2003 | Ozawa | G09G 3/006 345/100 |
| 6,873,174 | B2 * | 3/2005 | Matsunaga | G09G 3/006 324/760.02 |
| 7,129,936 | B2 * | 10/2006 | Aoki | G06F 11/006 345/204 |
| 7,167,117 | B2 * | 1/2007 | Choe | H03M 1/1071 341/120 |
| 7,453,450 | B2 * | 11/2008 | Sano | G09G 3/3688 345/204 |
| 7,456,647 | B2 * | 11/2008 | Jeon | G09G 3/006 324/760.01 |
| 7,567,092 | B2 * | 7/2009 | Park | G09G 3/006 324/760.01 |
| 7,750,661 | B2 * | 7/2010 | Hsu | G09G 3/006 324/760.01 |
| 9,201,549 | B2 * | 12/2015 | Al-Dahle | G06F 3/0412 |
| 9,326,375 | B2 * | 4/2016 | Lee | H05K 1/028 |
| 9,581,841 | B2 * | 2/2017 | Yanagisawa | G02F 1/1309 |
| 9,614,001 | B2 * | 4/2017 | Kawase | G09G 3/006 |
| 9,747,825 | B2 * | 8/2017 | Kim | G02F 1/1309 |
| 9,767,727 | B2 * | 9/2017 | Byun | G09G 3/3208 |
| 9,928,768 | B2 * | 3/2018 | Kim | G09G 3/2092 |
| 9,983,452 | B2 * | 5/2018 | Jia | G01R 31/2621 |
| 10,198,977 | B2 * | 2/2019 | Seo | G09G 3/006 |
| 10,210,782 | B2 * | 2/2019 | Lee | G09G 3/006 |
| 10,446,755 | B2 * | 10/2019 | Kwak | H01L 22/32 |
| 10,483,291 | B2 * | 11/2019 | Kwak | H01L 27/3297 |
| 2003/0184334 | A1 * | 10/2003 | Matsunaga | G09G 3/006 324/760.02 |
| 2004/0066382 | A1 * | 4/2004 | Aoki | G06F 11/006 345/204 |
| 2005/0219236 | A1 * | 10/2005 | Sano | G09G 3/3688 345/211 |
| 2006/0055572 | A1 * | 3/2006 | Choe | H03M 1/1071 341/120 |
| 2007/0236243 | A1 * | 10/2007 | Park | G09G 3/006 324/750.3 |
| 2008/0048708 | A1 * | 2/2008 | Hsu | G09G 3/006 324/754.03 |
| 2008/0238442 | A1 * | 10/2008 | Ryu | G09G 3/006 324/629 |
| 2008/0238443 | A1 * | 10/2008 | Ryu | G09G 3/006 324/629 |
| 2010/0053604 | A1 * | 3/2010 | Rice | H04N 9/3161 356/239.2 |
| 2010/0283773 | A1 * | 11/2010 | Kim | G09G 3/20 345/211 |
| 2011/0175800 | A1 * | 7/2011 | Mizumaki | G09G 3/006 345/87 |
| 2012/0229408 | A1 * | 9/2012 | Yamamoto | G06F 3/0412 345/173 |
| 2012/0235693 | A1 | 9/2012 | Feng | |
| 2013/0082843 | A1 * | 4/2013 | Wurzel | G06F 11/3044 340/635 |
| 2013/0082997 | A1 * | 4/2013 | Wurzel | G06F 11/3044 345/211 |
| 2013/0083457 | A1 * | 4/2013 | Wurzel | G06F 11/3044 361/679.01 |
| 2013/0099816 | A1 * | 4/2013 | Kawase | G09G 3/006 324/762.03 |
| 2014/0062845 | A1 * | 3/2014 | Brahma | G09G 3/006 345/92 |
| 2014/0062936 | A1 * | 3/2014 | Al-Dahle | G09G 3/36 345/174 |
| 2014/0062940 | A1 * | 3/2014 | Al-Dahle | G06F 3/0412 345/174 |
| 2014/0145739 | A1 * | 5/2014 | Park | G09G 3/006 324/750.3 |
| 2014/0159764 | A1 * | 6/2014 | Al-Dahle | G01R 31/2853 324/762.01 |
| 2014/0176844 | A1 * | 6/2014 | Yanagisawa | G02F 1/1309 349/43 |
| 2014/0217382 | A1 * | 8/2014 | Kwon | H01L 51/0097 257/40 |
| 2014/0307396 | A1 * | 10/2014 | Lee | H05K 1/028 361/749 |
| 2014/0331741 | A1 * | 11/2014 | Shah | G01N 3/30 73/12.06 |
| 2014/0368228 | A1 * | 12/2014 | Kim | G02F 1/1309 324/750.3 |
| 2015/0338951 | A1 * | 11/2015 | Lee | G06F 3/044 345/174 |
| 2016/0043010 | A1 * | 2/2016 | Kwak | H01L 22/14 257/48 |
| 2016/0225312 | A1 * | 8/2016 | Byun | G09G 3/3208 |
| 2016/0232826 | A1 * | 8/2016 | Cho | G09G 3/006 |
| 2016/0247430 | A1 * | 8/2016 | Cho | G09G 3/006 |
| 2016/0247436 | A1 * | 8/2016 | Lee | G09G 3/2003 |
| 2016/0260367 | A1 * | 9/2016 | Kwak | G09G 3/006 |
| 2016/0267826 | A1 * | 9/2016 | Seo | G09G 3/006 |
| 2016/0293078 | A1 * | 10/2016 | Byun | G09G 3/006 |
| 2016/0351093 | A1 * | 12/2016 | Kim | G09G 3/2092 |
| 2017/0047357 | A1 * | 2/2017 | Kwak | H01L 51/0097 |
| 2017/0192065 | A1 * | 7/2017 | Lee | G01R 31/44 |
| 2017/0199439 | A1 * | 7/2017 | Jia | G01R 31/2621 |
| 2017/0352302 | A1 * | 12/2017 | Kim | G02F 1/1309 |
| 2018/0032122 | A1 * | 2/2018 | Agrawal | G11C 16/30 |
| 2018/0033354 | A1 * | 2/2018 | Lee | G09G 3/006 |
| 2018/0033355 | A1 * | 2/2018 | Lee | G09G 3/20 |

* cited by examiner

ELECTRONIC DEVICE DISPLAY WITH MONITORING CIRCUITRY

This application claims the benefit of provisional patent application No. 62/377,483, filed Aug. 19, 2016, which is hereby incorporated by reference herein in its entirety.

BACKGROUND

This relates to electronic devices, and more particularly, to electronic devices with displays.

Electronic devices are often provided with displays. For example, cellular telephones, computers, and wristwatch devices may have displays for presenting images to a user.

Displays such as organic light-emitting diode displays may have flexible substrates. This allows portions of the display to be bent. The tail of a display may, for example, be bent when mounting the display in a compact device housing.

Challenges can arise in providing electronic devices with bent flexible displays. If care is not taken, mishandling during fabrication or stress due to drop events may damage the display.

SUMMARY

An electronic device may have a display mounted in a housing. The display may be a flexible display such as an organic light-emitting diode display. The display may have an array of pixels and a bent tail portion. The bent tail portion may bend about a bend axis. A display driver integrated circuit may supply data to columns of the pixels using data lines that extend across the bent tail portion. The display driver circuit may be coupled to the bent tail portion through a flexible printed circuit. A gate driver circuit may supply control signals to rows of the pixels using gate lines.

A strain sensing resistor may be formed on the bent tail portion of the flexible display to gather strain measurements. A temperature compensation resistor may be located adjacent to the strain sensing resistor. The strain sensing resistor and temperature compensation resistor may be formed from meandering metal traces. The meandering traces of the strain sensor may run perpendicular to the bend axis. The meandering traces of the temperature compensation resistor may run parallel to the bend axis. Resistance measurement circuitry in the display driver circuit may be used to measure the resistance of the strain sensing and temperature compensation resistors. Strain measurements may be obtained by subtracting the temperature compensation resistance from the strain sensing resistance.

A crack detection line may be formed form an elongated pair of traces that are coupled to form a loop. The crack detection line may run along the peripheral edge of the flexible display. Crack detection circuitry in the display driver integrated circuit may monitor the resistance of the crack detection line to detect cracks. If no cracks are present, crack detection line resistance will be low. In the presence of a crack, the resistance of the crack detection line will become elevated.

A shift register in the gate driver circuit may be provided with switches. The switches may be positioned at various positions along the length of the crack detection line and may be selectively closed to shorten the length of the signal path in the crack detection line by various amounts. By closing the switches in sequence while simultaneously measuring the resulting resistances of the crack detection line, the resistance of each of a plurality of segments of the crack detection line can be determined. This allows the positions of cracks within the crack detection line to be identified.

DETAILED DESCRIPTION

Figure 1:
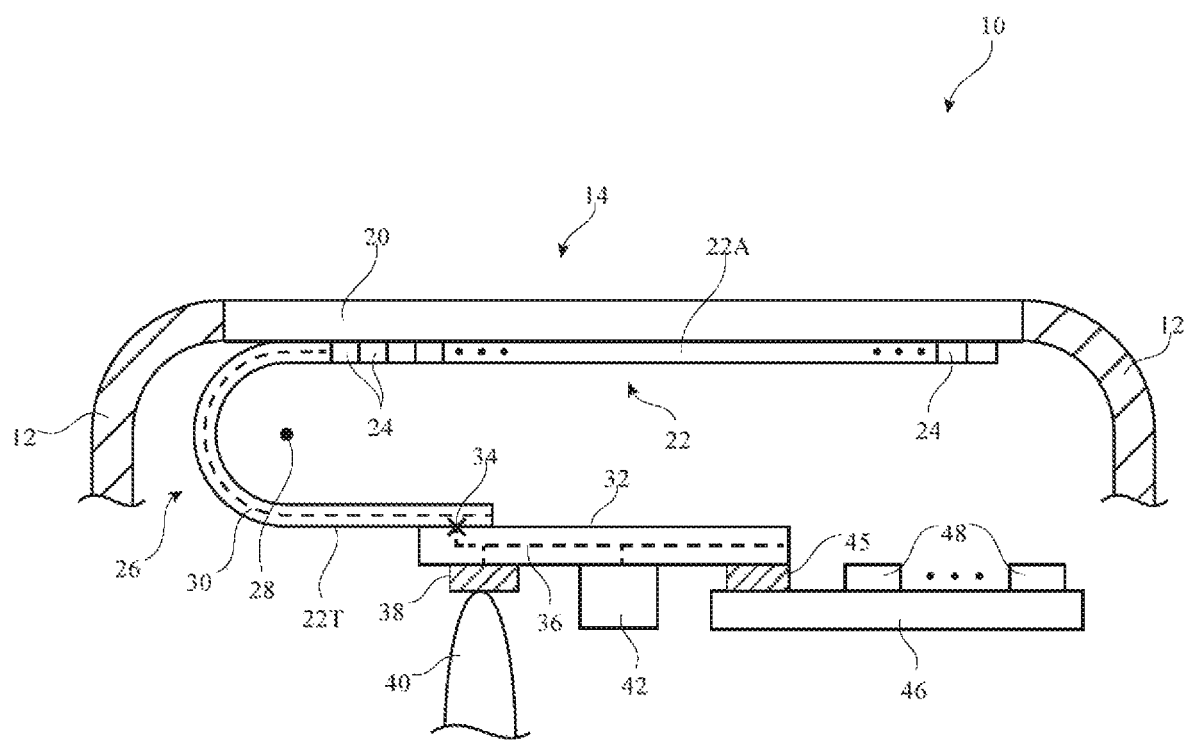
FIG. 1 is a cross-sectional side view of an illustrative electronic device in accordance with an embodiment.

An electronic device such as electronic device 10 of FIG. 1 may be provided with a flexible display having monitoring circuitry. The monitoring circuitry may include strain gauge monitoring circuitry for monitoring strain in the bent portion of a display and may include peripheral crack monitoring circuitry. The strain gauge monitoring circuitry may include strain gauge resistors on a bent portion of the flexible display and a strain gauge circuit that monitors for resistance changes arising when stress is applied to the bent portion of the flexible display. The peripheral crack monitoring circuitry may have a peripheral crack detection line formed from a loop-shaped signal path with two parallel metal traces that runs along the periphery of the active area of the display. A crack detection circuit may use resistance monitoring circuitry to measure resistance changes in one or more segments of the crack detection line that are indicative of cracking in the line and in structures elsewhere in the display.

Electronic device 10 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a wristwatch. Other configurations may be used for device 10 if desired. The example of FIG. 1 is merely illustrative.

Device 10 may have a display such as display 14. Display 14 may be mounted on the front face of device 10 in housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 12 may be formed using a unibody configuration in which some or all of housing 12 is machined or molded as a single structure or may be formed using multiple structures (e.g., an internal frame structure, one or more structures that form exterior housing surfaces, etc.). Housing 12 may have metal sidewalls or sidewalls formed from other materials, Display 14 may be a touch screen display that incorporates a layer of conductive capacitive touch sensor electrodes or other touch sensor components (e.g., resistive touch sensor components, acoustic touch sensor components, force-based touch sensor components, light-based touch sensor components, etc.) or may be a display that is not touch-sensitive. Capacitive touch screen electrodes may be formed from an array of indium tin oxide pads or other transparent conductive structures.

Display 14 may include an array of display pixels formed from liquid crystal display (LCD) components, an array of electrophoretic display pixels, an array of plasma display pixels, an array of organic light-emitting diode display pixels, an array of electrowetting display pixels, or display pixels based on other display technologies. Configurations in which display 14 includes organic-light-emitting diode structures may sometimes be described herein as an example.

Display 14 may have a thin flexible display layer (sometimes referred to as a pixel array, display, or flexible display) such as flexible display 22. Flexible display 22 may be formed from thin-film circuitry (e.g., thin-film transistors, thin-film organic light-emitting diodes, etc.) on a polymer substrate such as a flexible polyimide substrate. The thin-film circuitry may be encapsulated using one or more encapsulation layers (e.g., moisture barrier layers formed from organic and/or inorganic films). A transparent protective layer such as display cover layer 20 may overlap flexible display 22. Cover layer 20 may be formed from transparent glass, clear polymer, sapphire or other crystalline material, ceramic, or other transparent protective layer.

Flexible display 22 may have an array of pixels 24 (pixel array 22A) that form an active area for displaying images. Flexible display 22 may also have an inactive tail region such as tail 22T that is free of pixels 24. Images may be displayed for a user in pixel array 22A by pixels 24. Pixels 24 may be, for example, organic light-emitting diode pixels formed on a flexible polymer substrate (e.g., a polyimide substrate) and may be formed from thin-film circuitry on the substrate.

Metal traces such as metal traces 30 in flexible display 22 (e.g., data lines, control lines, etc.) may couple the circuitry of pixel array 22A with display driver circuitry such as display driver circuitry in display driver integrated circuit 42. In the example of FIG. 1, circuit 42 has been mounted on flexible printed circuit 32 and flexible printed circuit 32 has been coupled to flexible display 22. With this arrangement, display driver integrated circuit 42 may be coupled to pixel array 22A using metal traces 36 in flexible printed circuit 32 and metal traces 30 in flexible display 22. Metal traces 36 in flexible printed circuit 32 may be soldered to contact pads on integrated circuit 42. Metal traces 36 and metal traces 30 may also form mating pads that are coupled together at bonds 34. Bonds 34 may be anisotropic conductive film bonds or other conductive connections. If desired, display driver circuitry such as display driver circuitry 42 may be coupled to pixel array 22A with other arrangements. The use of flexible printed circuit 32 to couple circuit 42 to display 22 is merely illustrative.

Flexible display 22 may have a bent portion such as bent portion 26 that bends about bend axis 28. The inclusion of bent portion 26 in display 22 may help display 22 fit within housing 12. Display driver integrated circuit 42 may be coupled to system circuitry such as components 48 on one or more additional printed circuits such as printed circuit 46. Components 48 may include storage and processing circuitry for controlling the operation of device 10. Components 48 may be coupled to display driver circuit 42 and display 22 using connectors 45 (e.g., board-to-board connectors).

The bending of display 22 may create stress for traces 30. If mishandled during assembly or if subjected to stress from a drop event, there is a risk that traces 30 could become damaged. To help characterize the stresses to which display 22 is subjected, display 22 may be provided with strain monitoring circuitry. The strain monitoring circuitry may include, for example, strain gauge resistors on bent portion 26 of display 22. Crack monitoring circuitry may also be included in flexible display 22 (e.g., peripheral crack detection lines may run along one or more of the edges of pixel array 22A or other portions of display 22).

The monitoring circuitry may include resistors (strain gauge resistors, peripheral lines that have associated resistances, etc.) and circuitry for evaluating the resistances associated with the resistors. The resistors may be incorporated into sensitive portions of display 22 (e.g., bent portion 26, the edges of pixel array 22A, etc.).

The circuitry for measuring and evaluating the resistances may be formed in display driver integrated circuit 42, in other display driver circuitry (e.g., thin-film gate driver circuitry or gate driver integrated circuits on the edges of pixel array 22A), or may be formed using components 48. If desired, probe pads 38 may be formed on printed circuit 32 and/or on display 22 and these probe pads may be contacted by probes associated with test equipment. The test equipment may include resistance monitoring circuitry for monitoring resistance changes in strain gauge resistors and/or crack detection line resistance changes. Test equipment may also be coupled to the circuitry of display 22 using connector 45 or other coupling techniques (e.g., to monitor strain gauge resistors and/or crack detection resistors). During testing, test equipment may use electrically controlled actuators or other equipment to automatically apply stress to display 22 (e.g., to bend display 22 in region 26) and/or may otherwise manipulate display 22 while gathering data from monitoring structures in display 22. With this type of testing arrangement, the tester may, for example, direct the actuators to apply known amounts of stress to display 22 in bent portion 26 or other region of display 22 while using the strain gauge resistors or other monitoring sensors to gather corresponding measurements (e.g., strain gauge measurements). Configurations in which resistance measurement circuitry and other monitoring circuitry is incorporated into display driver integrated circuit 42 (see, e.g., resistance measurement circuitry such as circuit 44 in display driver integrated circuit 42 of FIG. 2) so that strain measurements and crack detection measurements may be made during fabrication or during normal use of device 10 by a user may sometimes be described herein as an example.

Figure 2:
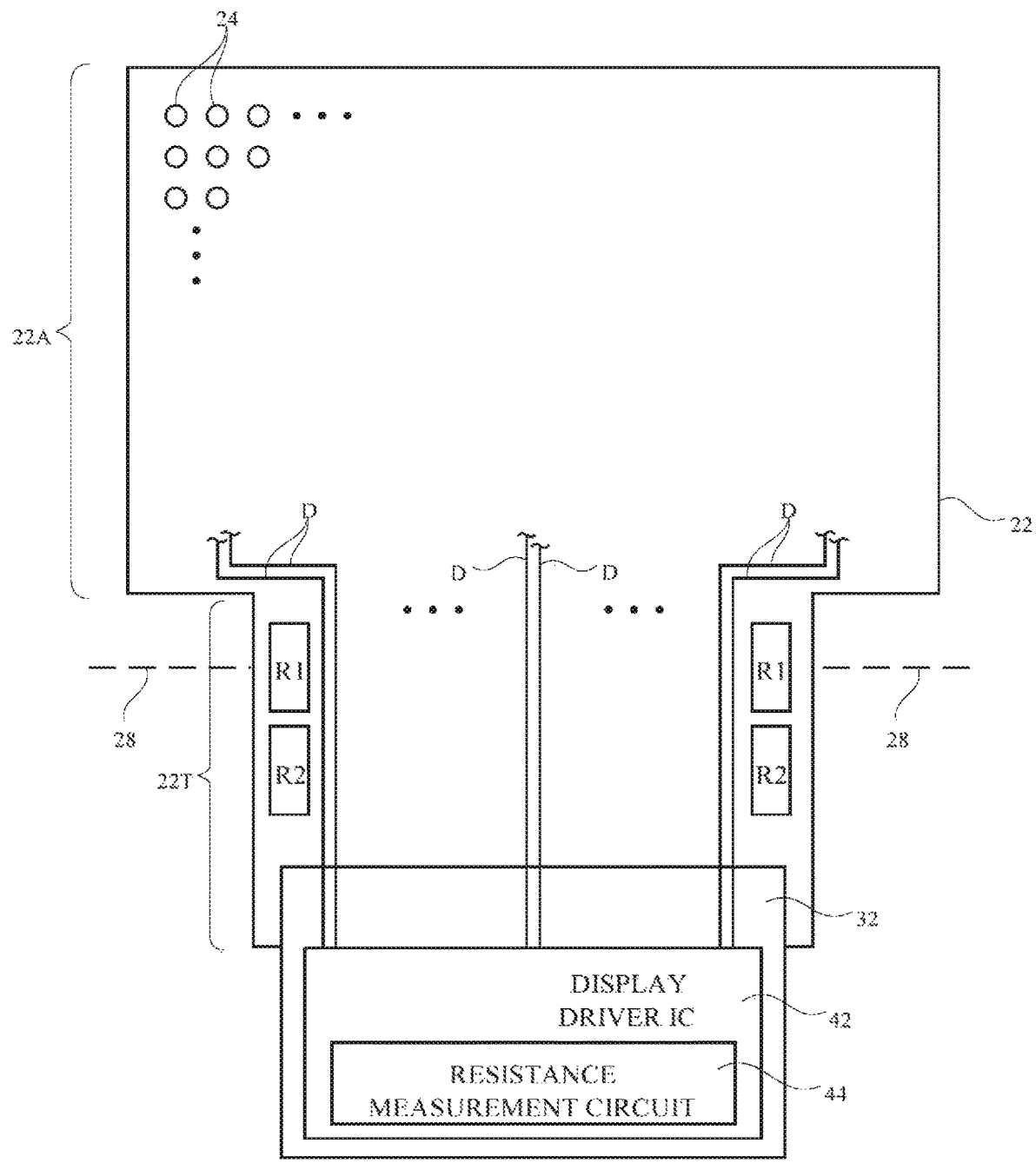
FIG. 2 is a top view of an illustrative flexible display with strain gauge monitoring resistors in accordance with an embodiment.

FIG. 2 is a top view of flexible display 22 in an unbent configuration. As shown in FIG. 2, pixel array 22A may include rows and columns of pixels 24. Gate driver circuitry (e.g., thin-film gate driver circuitry running along the left and/or right edges of pixel array 22A) may supply horizontal control signals to each row of pixels 24. These horizontal control signals, which may sometimes be referred to as gate line signals, may be used to control switching transistor in the pixel circuits associated with pixels 24 (e.g., for data loading, threshold voltage compensation operations, etc.). During data loading operations, data signals from display driver integrated circuit 42 may be supplied to columns of pixels 24 via respective data lines D.

Tail portion 22T of flexible display 22 may bend around bend axis 28. Strain gauge monitoring structures such as strain gauge resistors R1 and R2 and associated strain gauge circuitry in display driver integrated circuit 42 such as resistance measurement circuit 44 may be may be used in monitoring strain in tail portion 22T and may form a strain gauge that can gather real time strain gauge measurements.

The strain gauge may include one or more strain-sensing (strain-sensitive) resistors such as resistors R1. Resistors R1 may contain meandering metal traces that change resistance when bent. Resistors R1 may be placed on tail 22T in a location that overlaps bend axis 28, so that resistance changes in resistors R1 due to bending of display 22 in tail region 22T may be maximized.

The strain gauge may also include one or more temperature compensation strain gauge resistors such as temperature compensation resistors R2 (sometimes referred to as reference strain gauge resistors). Resistors R2 may have meandering metal trace that match those of resistors R1 so that both resistors R1 and resistors R2 experience the same responses to changes in operating temperature. Resistors R2 may be placed on tail 22T at locations that do not overlap bend axis 28 and may be oriented so that the traces in resistors R2 run perpendicular to the traces in resistors R1. As a result, resistors R1 will change resistance when tail 22T is bent about axis 28, but resistors R2 will not change resistance when tail 22T is bent about axis 28. This allows resistance measurements made with a reference resistor R2 to be subtracted from resistance measurements made with a strain-sensing resistor R1 to remove temperature-dependent effects from the strain gauge resistance measurements (e.g., to remove noise due to temperature fluctuations).

In the example of FIG. 2, display 22 has been provided with two sets of strain gauge resistors. A left-hand set (formed from a first strain-sensing resistor R1 overlapping bend axis 28 and a first associated temperature compensation resistor R2) may be located along the left-hand edge of tail 22T and may measure strain along the left side of tail 22T. A right-hand set (formed from a second strain-sensing resistors R1 overlapping bend axis 28 and a second associated temperature compensation resistor R2) may be located along the right-hand edge of tail 22T and may measure strain along the right side of tail 22T. By including strain measurement circuitry along both the right and left edges of tail 22T, strain data may be gathered that is sensitive to situations in which tail 22T is bent unevenly along the left and right of tail 22T (e.g., situations in which tail 22T is twisted).

Figure 3:
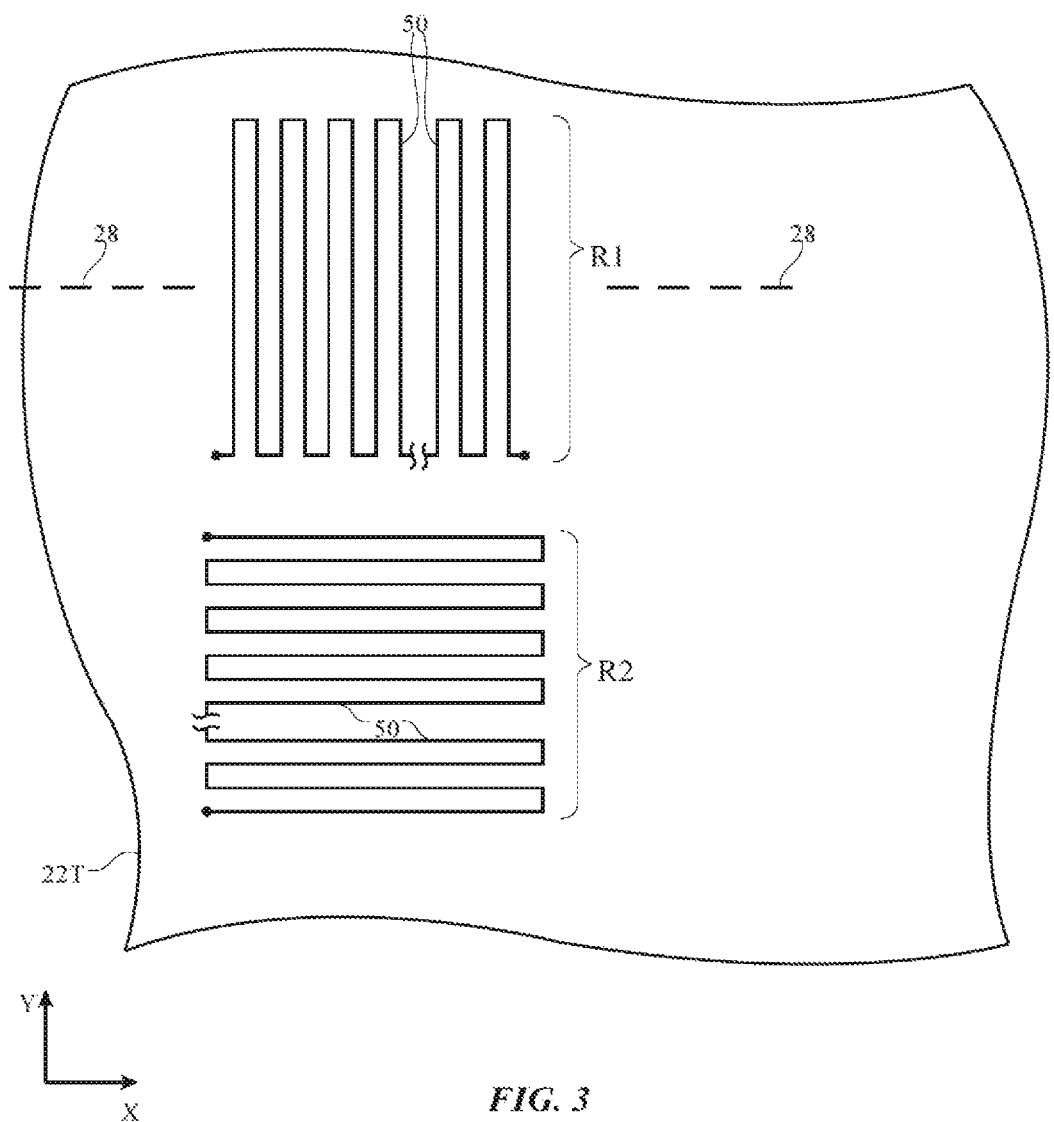
FIG. 3 is a top view of a portion of a flexible display with strain gauge resistors in accordance with an embodiment.

An illustrative trace layout for resistors R1 and R2 is shown in FIG. 3. As shown in FIG. 3, resistors R1 and R2 may have meandering paths formed from metal traces or other elongated conductive lines 50. There may be any suitable number of parallel elongated lines in each resistor (e.g., more than 5 lines, 10-100 lines, 20-50 lines, more than 20 lines, fewer than 200 lines, fewer than 150 lines, etc.). The width of the metal traces forming lines 50 may be 2-10 microns, 4-8 microns, more than 3 microns, less than 20 microns, or other suitable width. The length of the sides of each resistor may be, for example, more than 0.05 mm, more than 0.1 mm, more than 0.5 mm, less than 1 mm, or less than 2 mm, etc. Resistors R1 and R2 may be rectangular or may have other shapes. Lines 50 in resistor R1 may extend perpendicular to bend axis 28 (e.g., along dimension Y which is aligned with the longitudinal axis of tail 22T) to maximize bending of lines 50 and therefore changes in the resistance of R1 when tail 22T is bent. Lines 50 in temperature compensation resistor R2 may be parallel to lines 50 in resistor R1 or may be arranged parallel to bend axis 28 as shown in FIG. 3 to help reduce the sensitivity of resistor R2 to changes in the bending of tail 22T.

Figure 4:
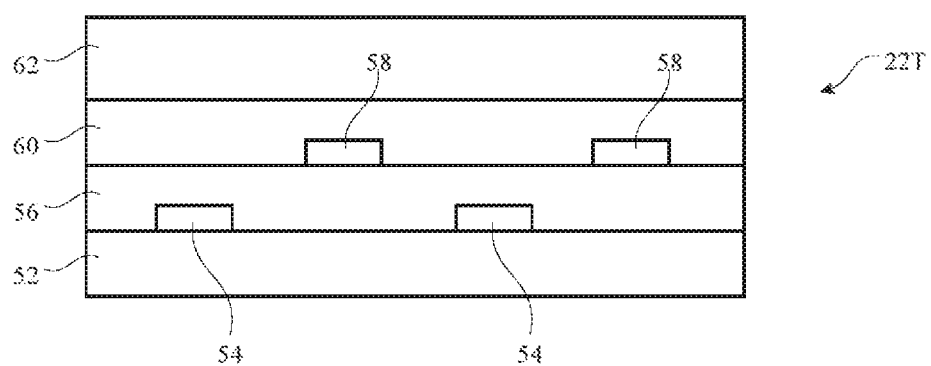
FIG. 4 is a cross-sectional side view of a portion of a flexible display with metal traces in accordance with an embodiment.

A cross-sectional side view of a portion of tail portion 22T of display 22 is shown in FIG. 4. As shown in FIG. 4, tail portion 22T may have a substrate such as substrate 52. Substrate 52 may be formed from a flexible polymer such as a layer of polyimide. Metal traces 54 may be formed on substrate 52 and may be covered with planarization layer 56. Metal traces 58 may be formed on planarization layer 56 and may be covered with planarization layer 60. In pixel array 22A, metal traces 54 and 58 may be used in forming thin-film transistor structures (e.g., source-drain terminals) and signal lines. In inactive tail portion 22T of display 22, metal traces 54 and 58 may form control signal lines and data lines D for carrying data from display driver integrated circuit 42 to pixels 24 in pixel array 22A. Planarization layers 56 and 60 may be formed from polymers or other suitable materials. Polymer layer 62 may serve as a neutral stress plane adjustment layer that helps move the neutral stress plane of tail 22T into alignment with traces 54 to minimize stress-induced cracking in traces 54 when tail 22T is bent. With this type of configuration, traces 58 may (as an example) experience more stress than traces 54 when tail 22T is bent. Accordingly, it may be desirable to form lines 50 for resistors R1 and R2 from the same metal layer that is used in forming lines 58 to maximize strain gauge sensitivity. Other layers of conductive material in display 22 may be patterned to form strain gauge resistors if desired. The use of the metal layer that is used in forming traces 58 to form strain gauge resistors is merely illustrative.

Figure 5:
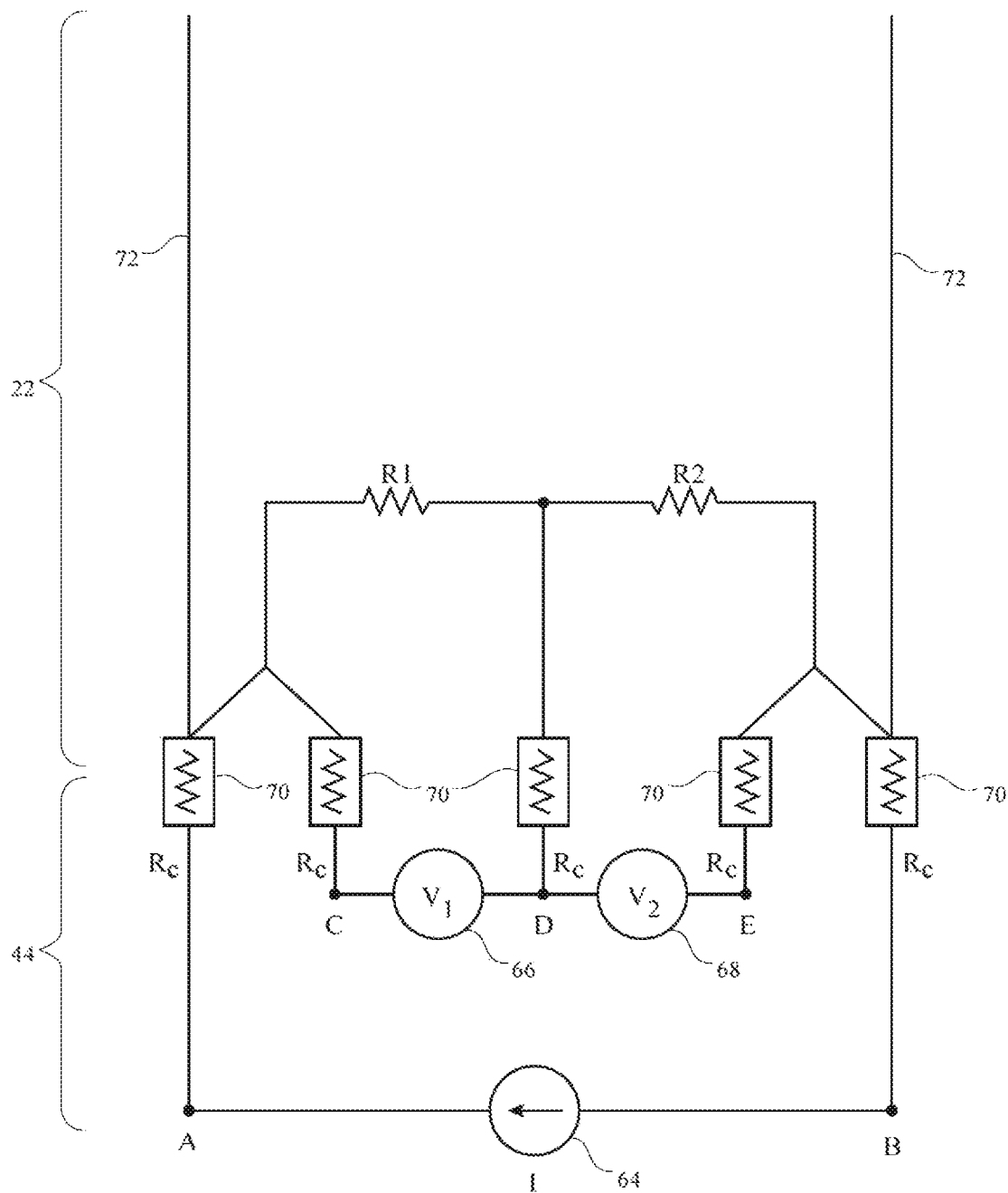
FIGS. 5, 6, and 7are circuit diagrams illustrative strain gauge circuits in accordance with an embodiment.

An illustrative strain gauge circuit is shown in FIG. 5. Resistance measurement circuitry 44 may be formed in display driver integrated circuit 42 (as an example) and may be coupled to resistors R1 and R2 on tail portion 22T using metal traces 36 in flexible printed circuit 32 and traces 30 in display 22. Bonds 34 between the pads formed from traces 36 and 30 and the portions of traces 30 and 36 that carry signals between resistors R1 and R2 and circuit 44 (shown collectively as paths 70) may have associated resistances Rc. For accurate strain gauge measurements, resistances Rc should be subtracted out of the strain gauge resistance measurements. Resistance changes in resistor R1 that are due to changes in temperature and not changes in strain can be measured using temperature compensation resistor R2 and can be subtracted from the measured resistance of resistor R1.

During operation, current source 64 may apply a known current I between terminals A and B. This causes current I to flow through resistors R1 and R2, which are coupled in series between terminals A and B. Voltage sensor 66 may measure the resulting voltage V1 between terminals C and D and voltage sensor 68 may measure the resulting voltage V2 between terminals D and E. The resistance of resistor R1 is equal to V1/I and the resistance of resistor R2 is V2/I. Resistances R1 and R2 are therefore independent of the value of resistance Rc associated with bonds 34. The resistance values for resistors R1 and R2 may be determined by resistance measurement circuitry 44 (e.g., using a processor circuit in circuitry 44) based on the known value of I and the measured values of V1 and V2. The processor circuitry may also subtract R2 from R1 to isolate changes in resistance R1 that are due to changes in the strain on resistor R1 (e.g., bending of lines 50 about axis 28, which can narrow lines 50 and thereby increase the resistance of lines 50). The measured changes in resistance R1 due to strain may be used as strain gauge measurements that reflect the amount of strain experienced by tail portion 22T in bend region 26.

The availability of contact pads on tail portion 22T may be limited due to the limited amount of area available on tail portion 22T. It may therefore be desirable to coupled terminals A and B to pads that are coupled to other lines in display 22 such as lines 72. Lines 72 may be, for example, positive power supply lines (e.g., lines that carry a positive power supply voltage Vdd to pixels 24 during normal operation of display 22). By piggybacking the measurement signals for measuring R1 and R2 through these contact pads, pad count can be minimized.

Figure 6:
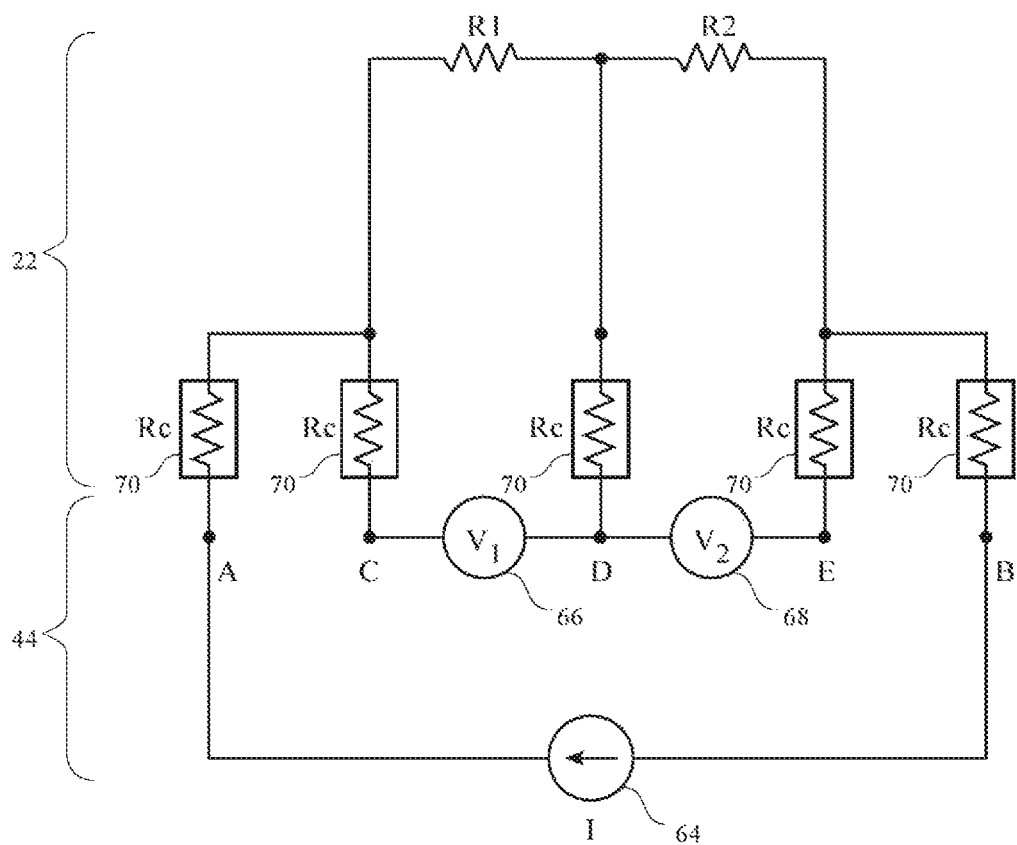

FIG. 6 shows how lines 72 may be omitted, if desired.

Figure 7:
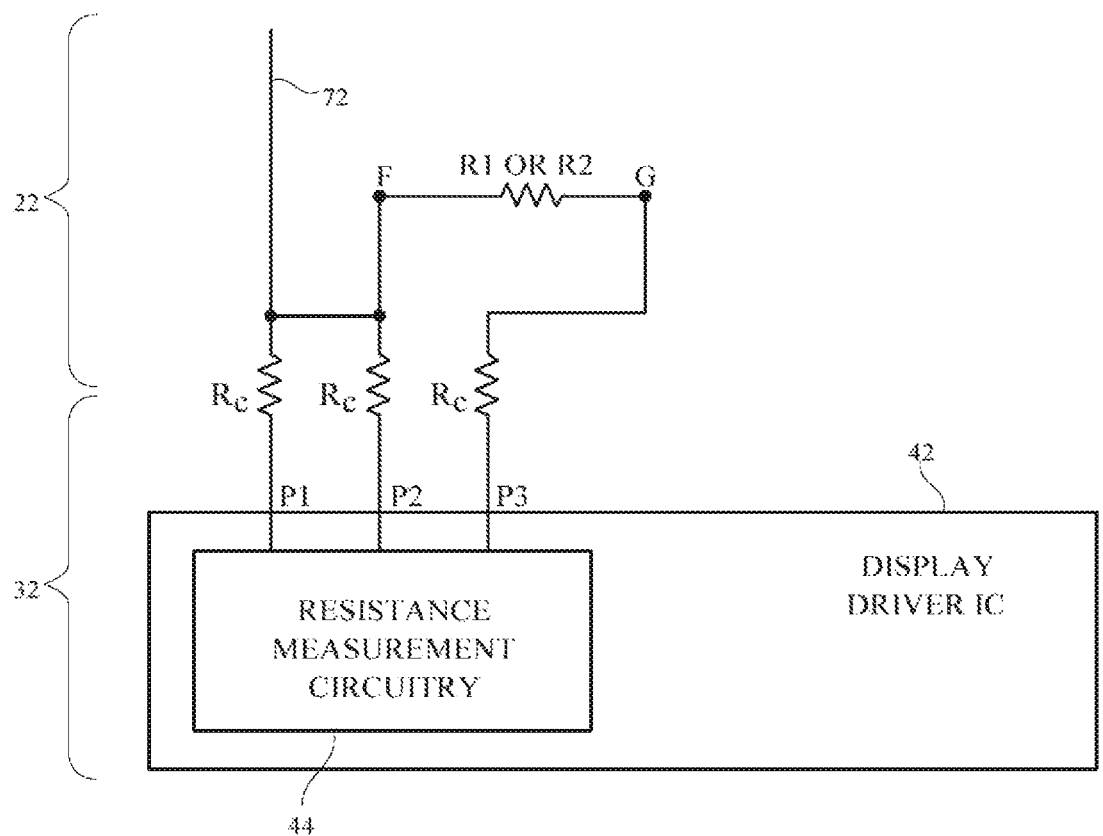

The number of pads used to measure resistances R1 and R2 may, if desired, be minimized using a resistance measurement arrangement of the type shown in FIG. 7. With this arrangement, resistance measurement circuitry 44 may measure the resistance RM1 between terminals P1 and P2 and may measure the resistance RM2 between terminals P2 and P3. Resistor R1 or R2 may be coupled between terminals F and G (e.g., separate circuits of the type shown in FIG. 7 may be used for measuring R1 and for measurement R2). After measuring RM1 and RM2, resistance measurement circuitry 44 can compute the value of the resistance between terminals F and G (either R1 or R2 depending on which strain gauge resistor is coupled between terminals F and G) by subtracting RM2 from RM1. This cancels out resistance Rc so that the measured strain gauge resistance values are independent of bond resistance.

Figure 8:
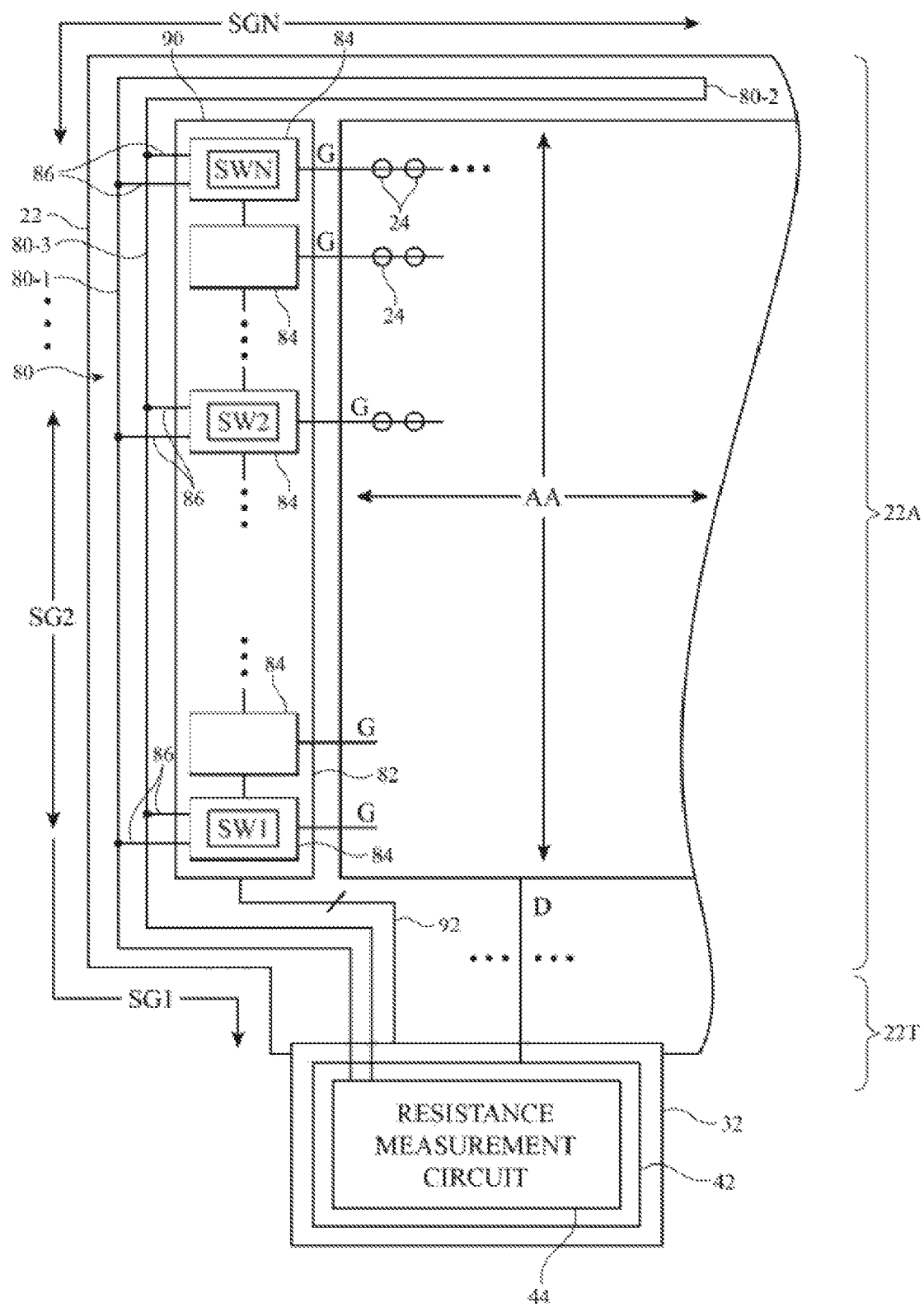
FIG. 8 is a diagram of an illustrative display with crack detection monitoring circuitry in accordance with an embodiment.

In addition to measuring strain in display 22, display 22 may incorporate crack detection circuitry. With one illustrative configuration, which is shown in FIG. 8, a crack detection line such as crack detection line 80 may run along some or all of the peripheral edge of display 22. Crack detection line 80 may be formed from metal (e.g., part of one of the metal layers used in forming pixels 24 such a gate metal layer, source-drain metal layer, anode metal layer, cathode metal layer, etc.). Crack detection line 80 may also be formed from semiconductor (e.g., polysilicon or semiconducting oxide) or other conductive material. Illustrative configurations in which crack detection line 80 is formed from metal traces may sometimes be described herein as an example.

Crack detection line 80 may have a loop shape formed from outgoing line 80-1, end connection path 80-2, and return line 80-3 (i.e., a metal trace that is parallel to the metal trace forming path 80-2). This allows line 80 to serve as a crack detection resistor. In the absence of damage to display 22, line 80 will be free of cracks and will be characterized by a low resistance. In the event that display 22 is subjected to stress that forms cracks in pixels 24 or other display circuitry, crack detection line 80, which is subjected to the same stress, will also develop cracks. The presence of cracks in crack detection line 80 will raise the resistance of line 80. The change in the resistance of line 80 can detected by crack detection circuitry 44 in display driver circuit 42 (or external crack detection circuitry in a tester, etc.). The crack detection circuitry can then report this result to circuit components 48 (e.g., control circuitry in device 10), may report this result to external equipment, or may present warnings on display 22 (as examples).

If desired, the crack detection circuitry for display 22 may measure the resistance of individual segments SG of line 80 such as segments SG1, SG2, . . . SGN. As shown in FIG. 8, the display driver circuitry of display 22 may include gate driver circuitry 90. Gate driver circuitry 90 may receive control signals (e.g., clock signals, start and stop pulses, etc.) from display driver circuit 42 via path 92. Gate driver circuitry 90 may contain a shift register formed from a chain of register circuits 84. Register circuits 84 may each supply horizontal control signals (e.g., scan signals, emission enable signals, etc.) to a corresponding row of pixels 24 (e.g., signals on illustrative gate lines G). During operation, circuit 42 initiates propagation of a control pulse through the shift register. As the control pulse propagates through the shift register, each gate line G (or other set of control signals) is activated in sequence, allowing successive rows of pixels 24 to be loaded with data from data lines D.

Gate driver circuitry 90 (e.g., some of register circuits 84) may be provided with switches SW1, SW2, . . . SWN, each of which selectively creates a short between lines (parallel metal traces) 80-1 and 80-3 at a different respective location along the length of line 80. As the control pulse propagates through the shift register, each of switches SW1, SW2, . . . SWN is activated in sequence. As each switch is closed, resistance measurement circuitry 44 may measure the resistance of line 80. When switch SW1 is closed, line 80 is shorted at switch SW1 and circuit 44 measures the resistance of segment SG1 of line 80. When switch SW2 is closed, line 80 is shorted at switch SW2 and circuit 44 measures the resistance of segments SG1 and SG2 together. This process continues until all switches have been closed and circuit 44 measures the resistance of all segments of line 80 (i.e., the entire length of line 80 from circuit 44 to connection path 80-2. Using these resistance measurements, the resistance of each individual segment can be determined by resistance measurement circuit 44. These resistance measurements can then be processed by the resistance measurement circuitry to determine whether the resistance of any segment is sufficiently high to reveal the presence of a crack.

Any suitable technique may be used by measurement circuitry 44 to measure the resistance of line 80. For example, resistance measurement circuitry 44 may measure the resistance of line 80 by applying a known voltage to a capacitor of known capacitance C and discharging that capacitor through line 80 while incrementing a counter or otherwise timing the decay time (RC time) associated with discharging the capacitor. The RC time can then be used to extract a measured resistance value R.

Figure 9:
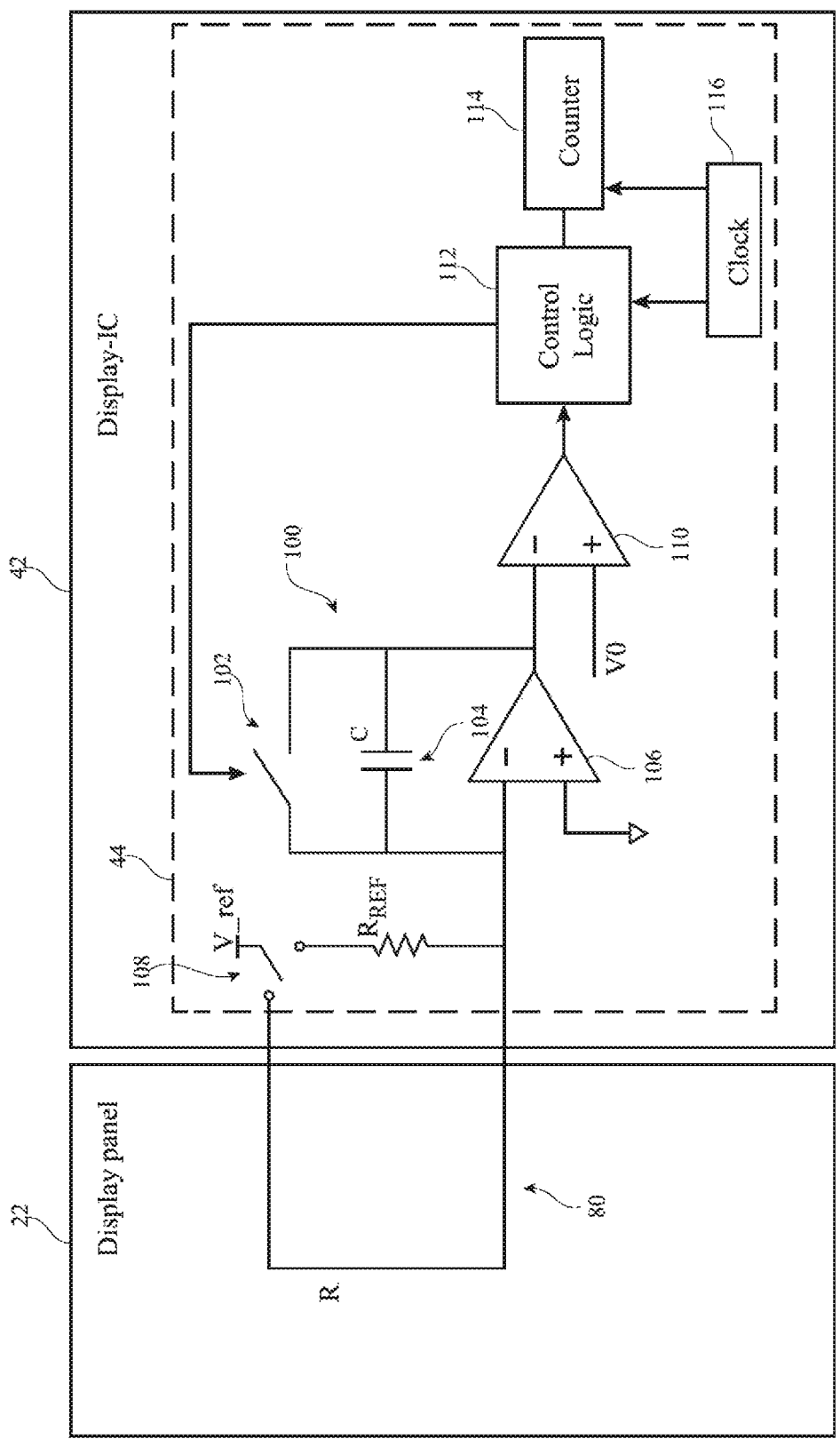
FIG. 9 is a diagram of an illustrative resistance measurement circuit that may be used to detect cracks in accordance with an embodiment.

Consider, as an example, a resistance measurement circuit such as illustrative resistance measurement circuitry 44 of FIG. 9. As shown in FIG. 9, resistance measurement circuitry 44 of display driver integrated circuit 42 may be coupled to crack detection line (resistor) 80 in display panel 22 (see, e.g., line 80 of FIG. 8). Resistance measurement circuitry 44 may make measurements of the resistance of line 80 while switches 84 (FIG. 8) are opened and closed so that segments of line 80 can be monitored for the presence of cracks.

Resistance measurement circuitry 44 may have an integrator such as integrator 100. Integrator 100 may have a capacitor such as capacitor 104 and an operational amplifier such as operational amplifier 106. The input of integrator 100 is coupled to line 80 and can be used to receive current that passes through reference resistor Rref or line 80 (of unknown resistance R) from reference voltage source Vref.

Clock 116 may supply clock signals to control logic 112 and counter 114. The clock signals may be used to increment a count value maintained by counter 114. When it is desired to perform a resistance measurement with integrator 100, control logic 112 may assert a control signal on line 118 that closes switch 102. Switch 102, which may sometimes be referred to as an integrator reset switch, is coupled across capacitor 104 and discharges capacitor 104 when closed. While discharging capacitor 104 to reset integrator 100, control logic 112 may also clear counter 114.

When making resistance measurements, control logic 112 may place resistance selection switch 108 in either a first state in which voltage Vref is coupled to integrator 100 via resistor Rref or a second state in which voltage Vref is coupled to integrator 100 via resistor (resistance) R. In the first state, a current equal to Vref/Rref flows into integrator 100. In the second state, a current equal to Vref/R flows into integrator 100, where R is the resistance of the currently selected segment SG of line 80 that is being measured.

During integration operations, switch 102 is placed in its open state and the voltage on capacitor 104 rises in proportion to the current flowing into integrator 100. The output of amplifier 106, which serves as the output of integrator 100, may be supplied to a first input of comparator 110. A second input of comparator 110 may be provided with reference voltage V0. Comparator 110 may compare the signals on its first and second inputs and may produce corresponding output signals at its output.

When the output from integrator 100 exceeds V0, the output of comparator 110 will change state (i.e., the output of comparator 110 will toggle). The change in state of the output of comparator 110 may be detected by control logic 112. In response to detection of the change of state of the comparator output, control logic 112 can obtain the current count value of counter 114. This count value is proportional to the magnitude of the current being integrated by integrator 100. The amount of time taken to charge the integrator output to V0 (the count value of counter 114) can be measured by control logic 112 in both the first state of resistor selection switch 108 (in which current Vref/Rref flows into integrator) and in the second state of resistor selection switch 108 (in which current Vref/R flows into integrator 100). Control logic 112 may then obtain the unknown value of resistance R from the count value obtained when switch 108 is in the first state and the count value obtained when switch 108 is in the second state.

Strain resistor measurements (e.g., strain data from strain sensor resistor R1) and/or crack detection resistor measurements (e.g., crack detection data such as measured resistance R from line 80) may be gathered during testing and analyzed to determine whether design changes should be made. Strain and crack detection measurements may be gathered by a tester having test probes that are coupled to pads in display 22 or pads in flexible printed circuit 32 and/or may be gathered by a tester that obtains digital measurements from resistance measurement circuitry 44 over a digital data communications path. Strain and crack measurements may be gathered during manufacturing to detect damaged parts so that they can be repaired or replaced. If desired, strain and crack data can be gathered during normal operation of device 10. Any suitable action may be taken in response to abnormal strain or crack data. For example, an alert may be presented on display 22 that informs a user that display 22 has been subjected to potentially damaging amounts of stress and should be serviced, historical data can be gathered (e.g., to detect whether device 10 has been dropped), and/or other actions may be taken in response to gathered strain and crack detection information. These alert techniques may also be used during testing and manufacturing.

The foregoing is merely illustrative and various modifications can be made to the described embodiments. The foregoing embodiments may be implemented individually or in any combination.

What is claimed is:

1. A display system, comprising:
a flexible display having an array of pixels;
a display driver integrated circuit that supplies data to columns of the pixels over data lines;
gate driver circuitry that supplies control signals to rows of the pixels over gate lines, wherein the gate driver circuitry includes a plurality of switches;
a crack detection resistor that runs along a peripheral edge of the flexible display, wherein the crack detection resistor has first and second parallel lines that are coupled to form a loop and wherein each of the switches couples the first parallel line to the second parallel line at a different respective location along the first and second parallel lines;
resistance measurement circuitry in the display driver integrated circuit that is configured to make resistance measurements on the crack detection resistor, wherein the resistance measurement circuitry is configured to process the resistance measurements to determine whether there are cracks in the crack detection line; and
a flexible printed circuit that is coupled to the flexible display, wherein the display driver integrated circuit is mounted to the flexible printed circuit.

2. The display system defined in claim 1 wherein the gate driver circuitry includes a shift register with a chain of register circuits and wherein each of the switches forms part of a respective one of the register circuits.

3. The display system defined in claim 2 wherein the resistance measurement circuitry comprises:
an integrator that integrates current from the crack detection resistor;
a comparator that compares output signals from the integrator to a reference voltage;
a counter;
control logic that makes the resistance measurements at least partly by obtaining a count value from the counter in response to detection of a change in state of an output from the comparator;
a reference resistor; and
a selection switch coupled between a reference voltage source and a selected one of: the reference resistor and the crack detection resistor.

4. A display system, comprising:
a flexible display having an array of pixels;
a display driver integrated circuit that supplies data to columns of the pixels over data lines;
gate driver circuitry that supplies control signals to rows of the pixels over gate lines;
a crack detection line that runs along a peripheral edge of the flexible display; and
resistance measurement circuitry in the display driver integrated circuit that measures the resistance on the crack detection line and processes the measured resistance to detect cracks in the crack detection line, wherein the resistance measurement circuitry comprises:
an integrator;
at least one reference resistor;
at least one selection switch configured to cause current from a selected one of the reference resistor and the crack detection line to pass to the integrator;

a comparator that compares output signals from the integrator to a reference voltage;
a counter; and
control logic configured to obtain a count value from the counter in response to detection of a change in state of an output of the comparator.

5. The display system defined in claim 4 wherein the crack detection line comprises first and second parallel traces that run along the peripheral edge of the flexible display and that have ends that are coupled by a connection path.

6. The display system defined in claim 5 further comprising a plurality of switches each of which is coupled between the first and second parallel traces at a different respective location along the first and second parallel traces.

7. The display system defined in claim 6 wherein the gate driver circuitry includes a shift register with a chain of register circuits and wherein each of the switches forms part of a respective one of the register circuits.

8. The display system defined in claim 6 wherein at least some of the switches form part of the gate driver circuitry.

9. The display system defined in claim 4 wherein the control logic is configured to obtain a first count value associated with integrating current with the integrator that passes through the at least one reference resistor and a second count value associated with integrating current with the integrator that passes through the crack detection resistor.

10. A display system, comprising:
a display having pixels;
gate driver circuitry that supplies control signals to the pixels;
a crack detection line that forms a loop running along a peripheral edge of the display, wherein the crack detection line comprises first and second parallel traces that run along the peripheral edge of the display and that have ends that are coupled by a connection path;
a display driver integrated circuit that supplies data to the pixels over data lines and that includes resistance measurement circuitry that measures a resistance on the crack detection line and processes the measured resistance to determine a position of a crack in the crack detection line; and
switches in the gate driver circuitry that are coupled to the crack detection line wherein each of the switches is coupled between the first and second parallel traces at a different respective location along the first and second parallel traces.

11. The display system defined in claim 10 wherein the resistance measurement circuitry comprises:
an integrator that integrates current passing through the crack detection line;
at least one reference resistor;
at least one selection switch configured to cause current from a selected one of the reference resistor and the crack detection resistor to pass to the integrator;
a comparator that compares output signals from the integrator to a reference voltage;
a counter; and
control logic configured to obtain a count value from the counter in response to detection of a change in state of an output of the comparator.

* * * * *